(12) United States Patent
Nakamura

(10) Patent No.: US 8,119,505 B2
(45) Date of Patent: Feb. 21, 2012

(54) METHOD OF MAKING GROUP III NITRIDE-BASED COMPOUND SEMICONDUCTOR

(75) Inventor: Ryo Nakamura, Aichi-ken (JP)

(73) Assignees: Toyoda Gosei Co., Ltd., Nishikasugai-gun, Aichi-ken (JP); Sumitomo Electric Industries, Ltd., Chuo-ku, Osaka (JP)

( * ) Notice: Subject to any disclaimer, the term of this patent is extended or adjusted under 35 U.S.C. 154(b) by 0 days.

(21) Appl. No.: 12/659,255

(22) Filed: Mar. 2, 2010

(65) Prior Publication Data

US 2010/0206218 A1   Aug. 19, 2010

Related U.S. Application Data

(62) Division of application No. 10/902,482, filed on Jul. 30, 2004, now Pat. No. 7,687,382.

(30) Foreign Application Priority Data

Aug. 1, 2003   (JP) ................................. 2003-284859

(51) Int. Cl.
*C30B 29/66*   (2006.01)
*H01L 21/20*   (2006.01)

(52) U.S. Cl. ......... 438/481; 257/E21.108; 257/E21.131; 257/E21.566; 117/95; 117/101; 117/923

(58) Field of Classification Search .................... 117/45, 117/95, 101, 923; 257/E21.108, E21.131, 257/E21.132, E21.566; 438/39, 41, 42, 44, 438/46, 481, 496

See application file for complete search history.

(56) References Cited

U.S. PATENT DOCUMENTS 6,153,010 A * 11/2000 Kiyoku et al. .................. 117/95
6,225,650 B1 * 5/2001 Tadatomo et al. ............. 257/190
(Continued)

FOREIGN PATENT DOCUMENTS

JP     11-191657     7/1999
(Continued)

OTHER PUBLICATIONS

Beaumont, B., et al. "Epitaxial Lateral Overgrowth of GaN." Phys. Stat. Sol. B, vol. 227, No. 1 (2001): pp. 1-43.*
(Continued)

*Primary Examiner* — Matthew W Such
(74) *Attorney, Agent, or Firm* — McGinn IP Law Group, PLLC

(57) ABSTRACT

A method of making a group III nitride-based compound semiconductor includes providing a semiconductor substrate comprising group III nitride-based compound semiconductor, polishing a surface of said semiconductor substrate such that said polished surface includes an inclined surface that has an off-angle θ of 0.15 degrees or more and 0.6 degrees or less to one of an a-face, a c-face and an m-face of the semiconductor substrate, providing a stripe-shaped specific region on the polished surface, the specific region comprising a material that prevents the growth of the group III nitride-based compound semiconductor on its surface, and growing a semiconductor epitaxial growth layer of group III nitride-based compound semiconductor on the polished surface of the semiconductor substrate. The specific region is provided on the polished surface such that the longitudinal direction of the specific region intersects with the longitudinal direction of a step portion that is formed with an atom-layer height on the polished surface by introducing the off-angle θ.

19 Claims, 10 Drawing Sheets

U.S. PATENT DOCUMENTS

| | | | |
|---|---|---|---|
| 6,252,255 | B1 | 6/2001 | Ueta et al. |
| 6,488,767 | B1 | 12/2002 | Xu et al. |
| 6,716,724 | B1 * | 4/2004 | Iyechika et al. ............ 438/481 |
| 6,855,959 | B2 * | 2/2005 | Yamaguchi et al. ........... 257/98 |
| 7,498,608 | B2 * | 3/2009 | Ito et al. .......................... 257/98 |
| 2001/0023946 | A1 * | 9/2001 | Ueta et al. ...................... 257/79 |
| 2001/0030329 | A1 * | 10/2001 | Ueta et al. .................... 257/103 |
| 2002/0121646 | A1 | 9/2002 | Khare et al. |
| 2002/0168844 | A1 * | 11/2002 | Kuramoto et al. ........... 438/604 |
| 2002/0171091 | A1 | 11/2002 | Goetz et al. |
| 2002/0197830 | A1 | 12/2002 | Watanabe et al. |
| 2003/0080345 | A1 | 5/2003 | Motoki et al. |
| 2005/0141577 | A1 * | 6/2005 | Ueta et al. ...................... 372/43 |
| 2006/0032428 | A1 | 2/2006 | Dwilinski et al. |

FOREIGN PATENT DOCUMENTS

| | | |
|---|---|---|
| JP | 2000-082676 | 3/2000 |
| JP | 2000-156348 | 6/2000 |
| JP | 2000-174395 | 6/2000 |
| JP | 2001-102307 | 4/2001 |
| JP | 2001-144378 | 5/2001 |
| JP | 2001-160539 | 6/2001 |
| JP | 2002-16000 | 1/2002 |
| JP | 2003-60318 | 2/2003 |
| WO | WO 2004-003261 | 1/2004 |

OTHER PUBLICATIONS

Vennegues, P., et al. "Reduction Mechanisms for Defect Densities in GaN using One- or Two-Step Epitaxial Lateral Overgrowth Methods." J. Appl. Phys., vol. 87 (2000): pp. 4175-4181.*

Xu, X., et al. "Growth and Characterization of Low Defect GaN by Hydride Vapor Phase Epitaxy." J. Crystal Growth, vol. 246 (2002): pp. 223-229.*

Shen, X.M., et al. "Structural Characterization of Epitaxial Lateral Overgrown GaN on Patterned GaN/GaAs(001) Substrates." J. Crystal Growth, vol. 246 (2002): pp. 69-72.*

Hiramatsu, K. "Epitaxial Lateral Overgrowth Techniques Used in Group III Nitride Epitaxy." J. Phys.: Condens. Matter, vol. 13 (2001): pp. 6961-6975.*

Kimoto, et al., "Step-Controlled Epitaxy in Semiconductor SiC Polytypes", Oyo Buturi, vol. 64, No. 67, pp. 691-694, 1995.

Motoki, et al., "Preparation of Large Freestanding GaN Substrates by Hydride Vapor Phase Epitaxy Using GaAs as a Starting Substrate", Japanese Journal of Applied Physics, vol. 40, Part 2, No. 2B, Feb. 15, 2001, pp. L140-L143.

Honda, et al., "Transmission Electron Microscopy Investigation of Dislocations in GaN Layer Grown by Facer-Controlled Epitaxial Lateral Overgrowth", Japanese Journal of Applied Physics, vol. 40, Part 2, No. 4A, Apr. 1, 2001, pp. L309-L312.

Mizutani, et al., "Reduction of Dislocation Density in GaN Using FACELO (Facet Controlled Epitaxial Lateral Overgrowth)", Technical Report of IEICE, ED2000-7, SDM2000-22, May 2000, pp. 35-40.

Motoki, et al., "Growth and Characterization of Freestanding GaN Substrates", Journal of Crystal Growth 237-239, 2002, pp. 912-921.

Notification of Reasons for Refusal dated Aug. 22, 2007 with a partial English translation.

Xu, X, et al. "Growth and Characterization of Low Defect GaN by Hydride Vapor Phase Epitaxy" J. Crystal Growth, vol. 246 (2002); pp. 223-229.

Zauner, et al., "Homo-Epitaxial Growth on Misoriented GaN Substrate by MOCVD" Mat. Res. Soc.Symp. vol. 595 (2000); W6.3.1-W6.3.6 Materials Research Society.

Zauner, et al., "Homoepitaxial Growth on Misoriented GaN Substrates by MOCVD", MRS Proceedings: Fall 1999, Symposium W. F99W6.3.

Matsumoto, et al., "Extremely Long Lifetime Blue Violet Laser Diodes Grown Homoepitaxially on GaN Substrates", Extended Abstracts of the 2002 International Conference on Solid State Devices and Materials, Nagoya, 2002, pp. 832-833.

* cited by examiner $\theta : 0.11°$ $\theta : 0.24°$

θ 1: 0.01°
θ 2: 0.24°

θ 1: 0.23°
θ 2: 0.01°

θ 1: 0.04°
θ 2: 0.03°

METHOD OF MAKING GROUP III NITRIDE-BASED COMPOUND SEMICONDUCTOR

RELATED APPLICATIONS

The present application is a divisional application of U.S. patent application Ser. No. 10/902,482 which was filed on Jul. 30, 2004 now U.S. Pat. No. 7,687,382.

The present application is based on Japanese patent application No. 2003-284859, the entire contents of which are incorporated herein by reference.

BACKGROUND OF THE INVENTION

1. Field of the Invention

This invention relates to a method of making a group III nitride-based compound semiconductor. This method is useful for the fabrication of various semiconductor devices, such as a semiconductor light emitting element and a semiconductor light receiving element.

2. Description of the Related Art

Conventionally, a technique is known that so called off angle (off-orientation) is introduced to the crystal growth surface of a crystal growth substrate so as to grow a high-quality semiconductor crystal. See, for example, Japanese patent application laid-open Nos. 2000-174395 (prior art 1), 2000-156348 (prior art 2), 2001-160539 (prior art 3) 2002-16000 (prior art 4) and 2003-60318 (prior art 5), and Tsunenobu KIMOTO and Hiroyuki MATSUNAMI, "Step-controlled epitaxy in semiconductor SiC polytypes", OYO BUTURI, vol. 64, No. 7, pp. 691-694 (1995) (prior art 6).

The typical or general function and principle of the step-flow growth induced by the setting of off-angle is described in prior art 6.

Prior arts 1 and 2 describe about trying to grow a high-quality group III nitride-based compound semiconductor on a heterosubstrate, such as sapphire, ZnO and spinel, of a different kind from the targeted growth layer (group III nitride-based compound semiconductor).

Prior arts 3 to 5 state that an off angle of 1 degree or more is desirable.

In growing a group III nitride-based compound semiconductor on a heterosubstrate, the matching of lattice constant on crystal growth surface is critical. Therefore, it is necessary to grow a buffer layer thereon to obtain a high-quality growth layer (semiconductor crystal). Thus, the method of using the heterosubstrate is not always desirable in terms of the quality and the number of fabrication steps concerning the targeted group III nitride-based compound semiconductor.

FIG. 1 is a schematic perspective view illustrating the problems of conventional techniques. As shown in FIG. 5, if the off angle is set to be more than 1 degree, the problem of step amplification occurs. For example, when a c-face of crystal growth substrate 1 of group III nitride-based compound semiconductor (e.g., GaN) is polished while having the off angle, a step portion y of about 1 atom layer to several tens of atom layers is formed on the polished surface σ. Subsequently, when a growth layer 2 of group III nitride-based compound semiconductor (e.g., GaN) is grown on the polished surface σ with the step portion y, a giant step Y that the height of step portion y is amplified may be generated on the upper side of growth layer 2. In this case, the width of a terrace (the interval of parallel giant steps Y) can be also significantly greater than that of the atom-layer height-formed step portion y on the polished surface σ.

The height of giant step Y is likely to increase according as the off angle of crystal growth substrate 1 increases. If the height of giant step Y becomes too high, the flatness of growth layer 2 (targeted group III nitride-based compound semiconductor) obtained thereupon will deteriorate. When using it for high-quality semiconductor devices, unignorable problems in terms of driving efficiency (current, voltage), operation life, heat generation etc.

On the other hand, if the off angle of crystal growth substrate 1 is too small, the growth layer 2 cannot grow based on the step-flow growth and, therefore, it is impossible to obtain a semiconductor crystal that has a good crystalline quality and a sufficiently flat surface. This can be proved by the general function and principle of step-flow growth as described in prior art 6.

SUMMARY OF THE INVENTION

It is an object of the invention to provide a method of making a group III nitride-based compound semiconductor that can offer a good crystalline quality and a sufficiently flat surface to the resulting semiconductor epitaxial growth layer.

It is another object of the invention to provide a method of making a group III nitride-based compound semiconductor that can offer increased efficiency.

Meanwhile, the above objects may be attained separately by any one of solutions of the invention, and it is not always guaranteed that one solution can solve simultaneously all of the problems.

The next solutions are effective in solving the above problems.

(1) According to the first solution of the invention, a method of making a group III nitride-based compound semiconductor comprises the steps of:

providing a semiconductor substrate with a polished surface, the semiconductor substrate being of group III nitride-based compound semiconductor; and growing a semiconductor epitaxial growth layer of group III nitride-based compound semiconductor on the semiconductor substrate, wherein the polished surface is an inclined surface that has an off-angle θ of 0.15 degrees or more and 0.6 degrees or less to a-face, c-face or m-face of the semiconductor substrate.

FIG. 2A is a perspective view illustrating a general definition of off-angle θ in case of c-face growth.

For example, when the off-angle θ as defined above is introduced by polishing the c-face while removing a portion g, the normal vector of polished surface σ on the crystal growth substrate 1 of group III nitride-based compound semiconductor is directed to a direction being inclined by the same off-angle from a c-axis, as shown in FIG. 2A, where the off-angle θ is emphasized for illustration purpose.

The next equation (A) is established when the off-angle θ is sufficiently small:

$$\theta^2 = \theta_1^2 + \theta_2^2 \tag{A}$$

where θ1 is an off-angle to an a-axis direction (a rotation angle around an m-axis to the c-face of polished surface σ), and θ2 is an off-angle to the m-axis direction (a rotation angle around the a-axis to the c-face of polished surface σ).

Although in FIG. 2A the case of c-face growth is illustrated, the same definition can be also used in the case of a-face growth and m-face growth. For example, FIG. 2B illustrates a case of a-face growth and FIG. 2C illustrates a case of m-face growth.

Herein, "group III nitride-based compound semiconductor" includes compound semiconductors that are of two-element, three-element or four-element, have an arbitrary mixed crystal ratio, and are represented by a general formula: $Al_{1-x-y}Ga_yIn_xN$ ($0 \leqq x \leqq 1$, $0 \leqq y \leqq 1$, and $0 \leqq 1-x-y \leqq 1$). Further, the group III nitride-based compound semiconductor includes the compound semiconductors with p-type and/or n-type impurity doped thereinto.

At least part of the group III element mentioned above may be replaced by boron (B), thallium (Tl) etc. At least part of nitrogen (N) maybe replaced by phosphorous (P), arsenic (As), antimony (Sb), bismuth (Bi) etc.

The p-type impurity (acceptor) mentioned above may include a known p-type impurity such as magnesium (Mg) and calcium (Ca).

The n-type impurity (donor) mentioned above may include a known n-type impurity such as silicon (Si), sulfur (S), selenium (Se), tellurium (Te) and germanium (Ge).

The p-type or n-type impurity (acceptor or donor) of two or more elements may be simultaneously contained. The p-type and n-type impurities may be simultaneously contained.

In growing the growth layer 2 (group III nitride-based compound semiconductor) on the semiconductor substrate, various growth methods such as MOVPE, HVPE, MBE and MOHVPE (metalorganic hydrogen chloride vapor phase epitaxy) described in prior art 7 as listed below may be used. Prior art 7: "preparation of Large Freestanding GaN Substrates by Hydride Vapor Phase Epitaxy Using GaAs as a Starting Substrate", JAPANESE JOURNAL OF APPLIED PHYSICS, Vol. 40 (2001) pp. L140-L143, Part 2, No. 2B, 15 Feb. 2001.

By the first solution of the invention, the growth layer (group III nitride-based compound semiconductor) can be grown on the semiconductor substrate (group III nitride-based compound semiconductor) while having the off-angle necessary and sufficient for inducing the step-flow growth. If the off-angle is too small, the step-flow growth cannot be induced sufficiently. On the other hand, if the off-angle is too big, the problem of giant step (Y in FIG. 1) described earlier will occur. Thus, it is desired that the off-angle is set in the above-mentioned range so as to obtain a growth layer with a high crystalline quality and a sufficiently flat surface.

By the first solution, the growth layer (group III nitride-based compound semiconductor) with a high crystalline quality and a sufficiently flat surface can be obtained. When the growth layer is applied to a semiconductor device, the semiconductor device will be significantly advantageous in terms of driving efficiency (current, voltage), operation life, heat generation etc. For example, when the growth layer is used as a substrate for semiconductor laser, the semiconductor laser can enjoy low threshold current, low consumed current, high output and long operation life.

Further, by the first solution, a high crystalline quality growth layer (group III nitride-based compound semiconductor) can be obtained without using the buffer layer. Therefore, the number of fabrication steps can be advantageously reduced.

Although some crystal growth apparatuses cannot be used for aluminum (Al), the above solution can be applied to even such apparatuses.

(2) According to the second solution of the invention, in the first solution, the polished surface is a c-face in its principle surface, and the off-angle θ is 0.2 degrees or more and 0.35 degrees or less.

When the second solution (0.2 degrees$\leqq \theta \leqq$0.35 degrees) is applied to the case of using the c-face as principle surface polished, it is known by experience that the growth layer can have a further high crystalline quality.

(3) According to the third solution of the invention, in the first or second solution, the method further comprises the step of:

providing a stripe-shaped specific region on the polished surface, the specific region being composed of a material that prevents the growth of the group III nitride-based compound semiconductor on its surface, wherein the specific region is provided on the polished surface such that the longitudinal direction of the specific region intersects with the longitudinal direction of a step portion that is formed with an atom-layer height on the polished surface by introducing the off-angle θ.

The stripe-shaped specific region may be formed such that the stripe is locally disconnected in the longitudinal direction.

By the third solution of the invention, since the stripe-shaped specific region that is not likely to be a crystal growth surface intersects with, i.e., being not parallel to, the step portion, a situation (growth state) that the stripe-shaped specific region completely interferes with the step-flaw growth using the step portion as the starting point (nucleus) can be avoided.

Thus, by the third solution, since the specific region is not likely to interfere with step-flow growth, the probability that the growth mode of step-flow growth is shifted to the growth mode of two-dimensional nucleus generation can lower. As a result, the growth mode of step-flow growth can be well maintained. Thus, the crystal growth surface with a high crystalline quality and a sufficiently flat surface can be obtained.

(4) According to the fourth solution of the invention, in the third solution, the stripe-shaped specific region is of an amorphous mask material.

For example, the mask material may be a material used in the conventional ELO method. The specific region may be of an arbitrary material if the material can prevent the growth of the group III nitride-based compound semiconductor on the surface. For example, a stripe-shaped ELO mask is available that is used in conducting so-called facet-controlled ELO as described prior arts 8 and 9 listed below. Prior art 8: "Transmission Electron Microscopy Investigation of Dislocations in GaN Layer Grown by Facet-controlled Epitaxial Lateral Overgrowth", JAPANESE JOURNAL OF APPLIED PHYSICS, Vol. 40 (2001) pp. L309-L312, Part 2, No. 4A, 1 Apr. 2001. Prior art 9: Mizutani et al., "Reduction of Dislocations in GaN by FACELO (Facet-controlled ELO)", TECHNICAL REPORT OF IEICE, ED2000-22, CPM2000-7, SDM2000-22(2000-05), pp. 35-40.

By the fourth solution of the invention, the specific region can be easily composed of (designed and formed by using) an amorphous mask material by using known general methods such as a masking technique for ELO mask.

(5) According to the fifth solution of the invention, in the first or second solution, the method further comprises the step of:

providing a stripe-shaped specific region on the polished surface, the specific region being composed of a structure that has a relatively low growth speed in growing the group III nitride-based compound semiconductor on its surface, wherein the specific region is provided on the polished surface such that the longitudinal direction of the specific region intersects with the longitudinal direction of a step portion that is formed with an atom-layer height on the polished surface by introducing the off-angle θ.

The stripe-shaped specific region may be formed such that the stripe is locally disconnected in the longitudinal direction.

The stripe-shaped specific region may be a region that is composed of polycrystal locally formed on the semiconductor substrate or a region that is composed of a crystal surface different from the other principle region (i.e., a region other than the specific region). The specific region may be composed of an arbitrary structure if the structure has a relatively low growth speed in growing the group III nitride-based compound semiconductor on the surface.

Especially, the next solution is provided to cope with a stripe-shaped region called "core regions" as described in prior art 10 listed below. Prior art 10: "Extremely Long Lifetime Blue-violet Laser Diodes Grown Homoepitaxially on GaN Substrates", Extended Abstracts of the 2002 International Conference on Solid State Devices and Materials, Nagoya, 2002, pp. 832-833.

By the fifth solution of the invention, since the stripe-shaped specific region that has a relatively low crystal growth speed intersects with, i.e., being not parallel to, the step portion, a situation (growth state) that the stripe-shaped specific region completely interferes with the step-flow growth using the step portion as the starting point (nucleus) can be avoided.

Thus, by the fifth solution, since the specific region is not likely to interfere with step-flow growth, the probability that the growth mode of step-flow growth is shifted to the growth mode of two-dimensional nucleus generation can lower. As a result, the crystal growth surface with a high crystalline quality and a sufficiently flat surface can be obtained.

The specific region may be intentionally formed on the substrate provided, or may be formed by the method of removing a defect such as dislocation from main part of a targeted device.

(6) According to the sixth solution of the invention, in the fifth solution, the stripe-shaped specific region is composed of a crystal defect-concentrated region that crystal defects of group III nitride-based compound semiconductor are locally and densely concentrated.

Such a crystal defect-concentrated region is described in prior art 10. A substrate with a stripe-shaped region called "core regions" is known and is in common use. The crystal defect-concentrated region may be formed by properly combining crystal growth methods as described in prior arts 7 listed earlier, 11 and 12 listed below. Prior art 11: Japanese patent application laid-open No. 2001-102307. Prior art 12: "Growth and Characterization of Freestanding GaN Substrates", Journal of Crystal Growth 237-239 (2002) 912-921.

By the sixth solution of the invention, the crystal defect-concentrated region as described in prior art 7, which is previously formed on the substrate, can be used as the specific region.

(7) According to the seventh solution of the invention, in any one of the third to sixth solutions, a plurality of the stripe-shaped specific regions are formed nearly in parallel with each other on the polished surface.

By the sixth solution of the invention, even when the plurality of stripe-shaped specific regions are formed, the probability that the growth mode of step-flow growth is shifted to the growth mode of two-dimensional nucleus generation can lower. As a result, the crystal growth surface with a high crystalline quality and a sufficiently flat surface can be obtained.

(8) According to the eighth solution of the invention, in any one of the third to seventh solutions, the longitudinal direction of the stripe-shaped specific region is nearly orthogonal to the longitudinal direction of a step portion that is formed with an atom-layer height on the polished surface by introducing the off-angle $\theta$.

If the stripe-shaped specific region intersects with the longitudinal direction of step portion, the step-flow growth can be theoretically continued regardless of the measure of inter-section angle. However, as defined by the eighth solution, it is desirable that the stripe-shaped specific region is nearly orthogonal to the longitudinal direction of step portion. In this case, since the growth direction of step-flow growth nearly coincides with the longitudinal direction of step portion, the stripe-shaped specific region does not interfere with the step-flow growth using the step portion as the starting point (nucleus) during the crystal growth. Thus, by the eighth solution, the growth mode of step-flow growth can be stably and continuously maintained. As a result, the crystal growth surface with a high crystalline quality and a sufficiently flat surface can be obtained.

(9) According to the ninth solution of the invention, in any one of the third to eighth solutions, the longitudinal direction of the stripe-shaped specific region is set to be parallel to an m-axis direction of the semiconductor substrate.

By the ninth solution of the invention, a resonator of semiconductor laser can be placed in parallel with the stripe direction (longitudinal direction) of specific region.

A resonator of edge emission type semiconductor laser uses generally an m-face that is easy to obtain a mirror surface by cleavage. Thus, by the arrangement of the ninth solution, the resonator can be disposed such that it is not located over the stripe-shaped specific region. Therefore, the resonator disposed is not negatively affected by the specific region and is provided with an edge of good quality. Accordingly, the ninth solution can offer a high crystalline quality and a good edge flatness to the resonator.

Thus, by the ninth solution, a good growth layer can be obtained that is versatile enough to be used as a resonator of edge emission type semiconductor laser.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
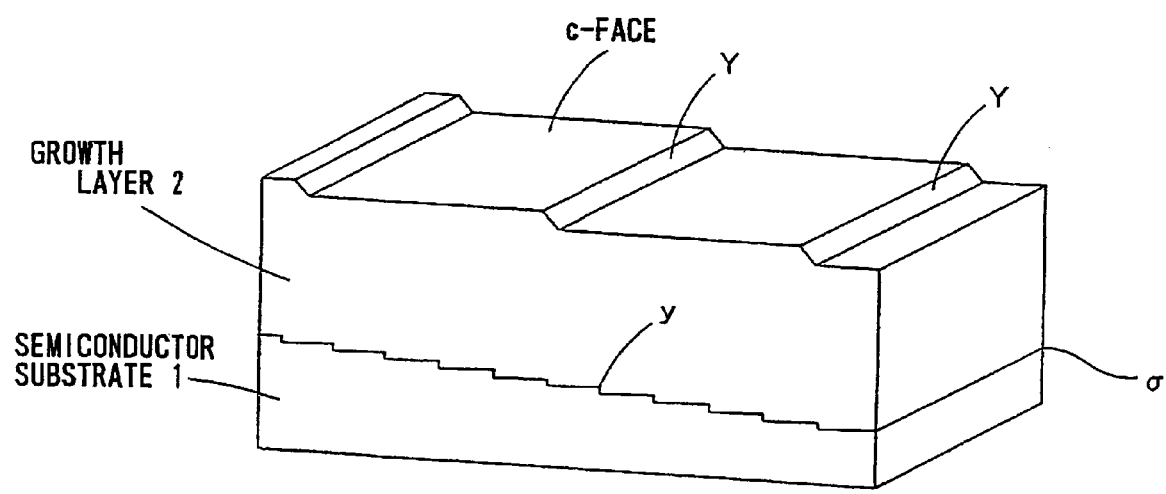
FIG. 1 is a schematic perspective view illustrating the problems of conventional techniques.
Figure 2A:
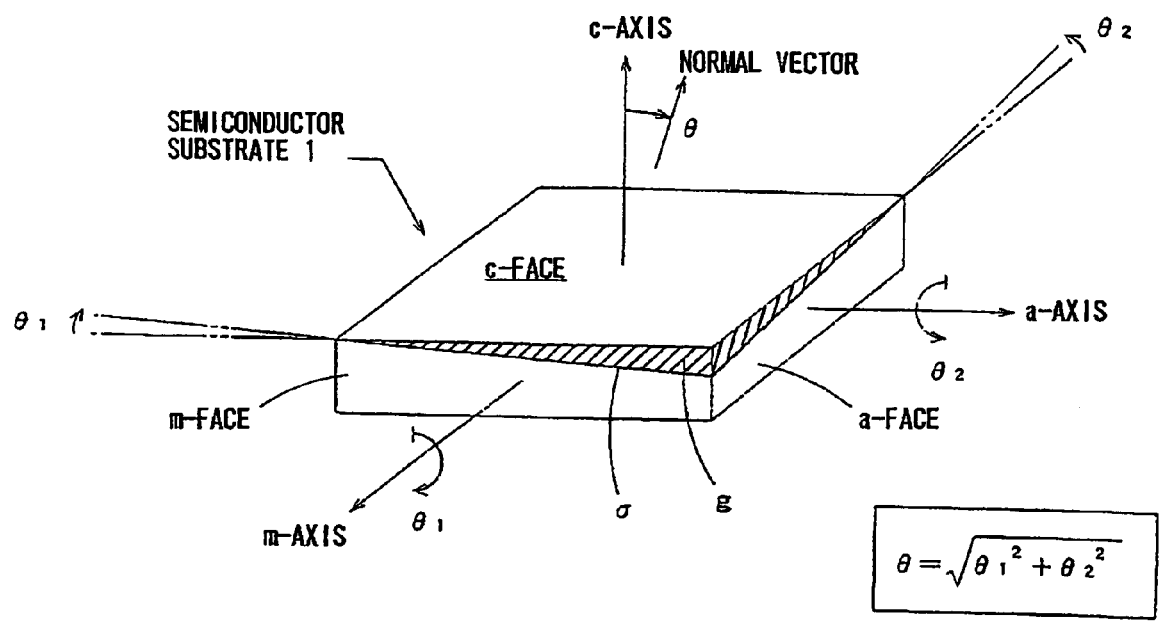
FIG. 2A is a perspective view illustrating a general definition of off-angle $\theta$ in case of c-face growth.
Figure 2B:
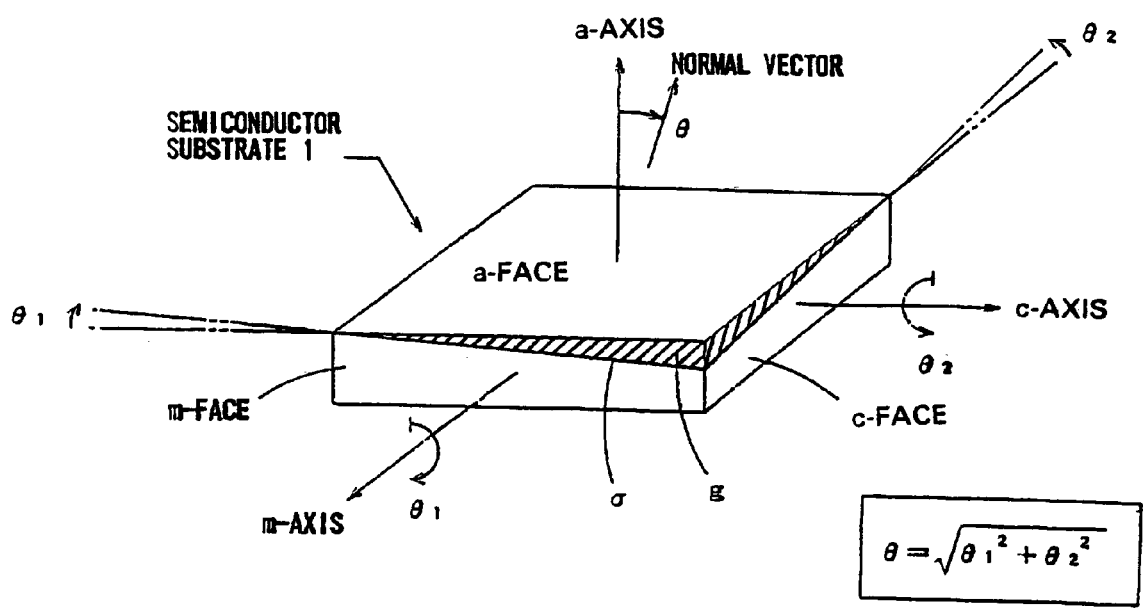
FIG. 2B is a perspective view illustrating a general definition of off-angle $\theta$ in case of a-face growth.
Figure 2C:
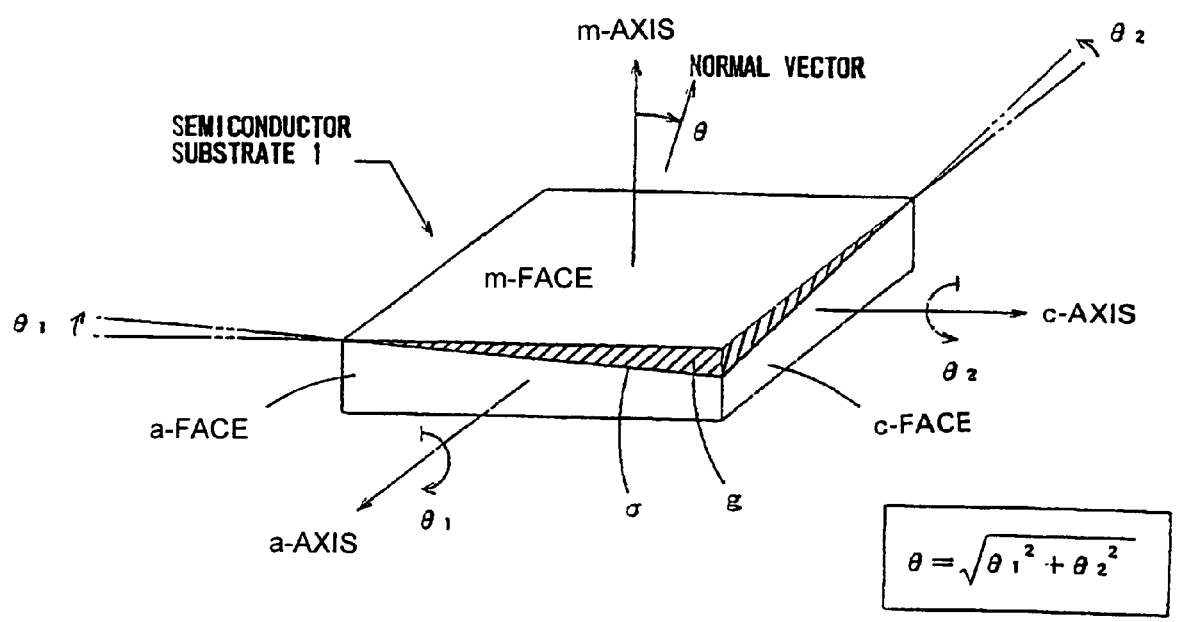
FIG. 2C is a perspective view illustrating a general definition of off-angle $\theta$ in case of m-face growth.
Figure 3A:
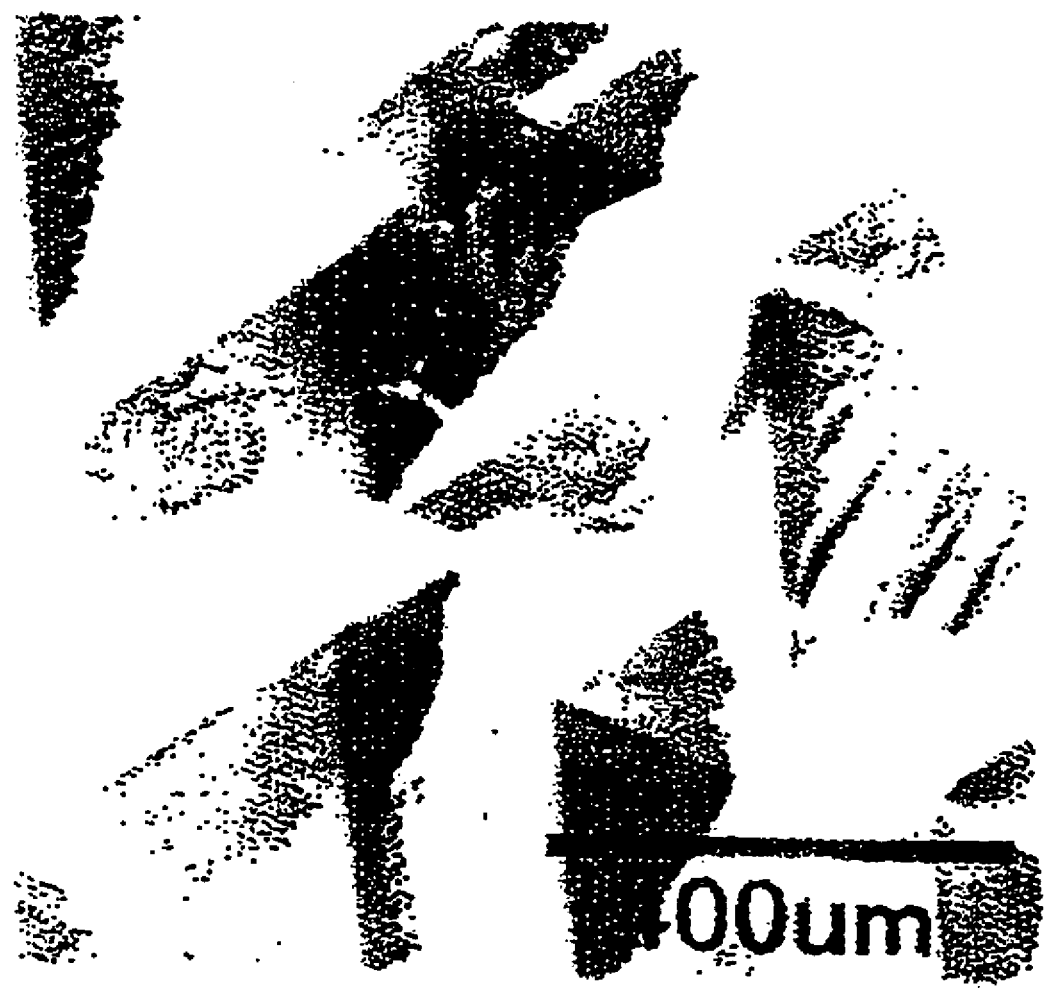
FIG. 3A is a photomicrograph showing a crystal growth surface of growth layer after crystal growth when setting the off-angle $\theta$ to be 0.11 degrees.
Figure 3B:
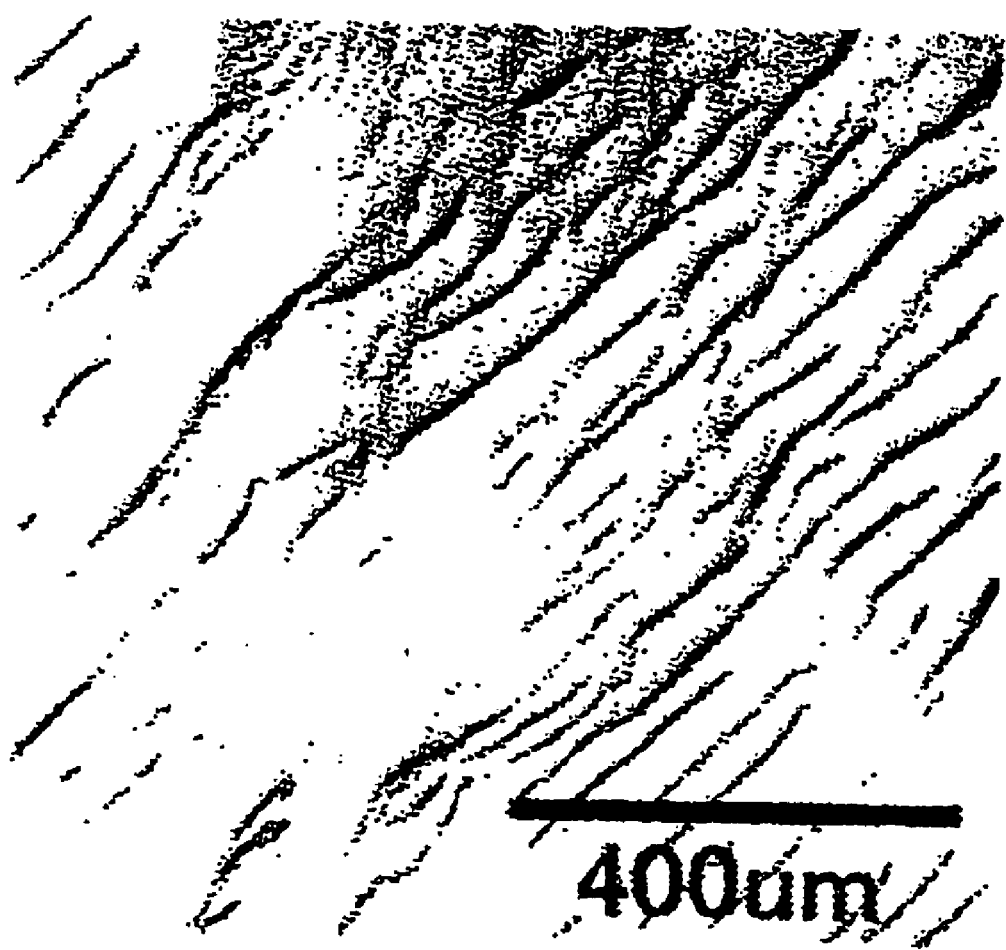
FIG. 3B is a photomicrograph showing a crystal growth surface of growth layer after crystal growth when setting the off-angle $\theta$ to be 0.24 degrees.

FIGS. 3A and 3B are photomicrographs showing a crystal growth surface of the growth layer 2 after crystal growth when setting the off-angle $\theta$ to be 0.11 degrees ($\theta 1=0.04$ degrees, $\theta 2=0.10$ degrees) and 0.24 degrees ($\theta 1=0.04$ degrees, θ2=0.02 degrees), respectively in the structure as shown in FIG. 2A. The semiconductor substrate 1 (FIG. 2A) used therein is prepared by growing a high-quality semiconductor crystal of gallium nitride (GaN) by HVPE. In polishing the portion g, a slurry of about 1 μm is used on the final polishing stage.

The growth layers 2 as shown in FIGS. 3A and 3B are made under the same crystal growth conditions. The process of growing the growth layer 2 will be explained below.

At first, the semiconductor substrate 1 (θ=0.11 degrees, 0.24 degrees) after the polishing is washed and then is preliminarily heated to 1150 degree ° C.

Then, while keeping the semiconductor substrate 1 at 1150 degree ° C., the growth layer 2 of GaN with a thickness of 6 μm is grown on the polished surface σ by MOVPE. The materials used thereat are trimethylgallium ($Ga(CH_3)_3$) and ammonium ($NH_3$). Flow gas $H_2$ is supplied at 10 liters/min., $NH_3$ at 10 liters/min., and TMG ($Ga(CH_3)_3$) at $2.0\times10^{-4}$ mol/.

As shown in FIG. 3B, the crystal growth surface of growth layer 2 is flattened. It can be thus estimated that the step-flow growth is smoothly conducted by setting the off-angle to be 0.24 degrees. In contrast, as shown in FIG. 3A, the crystal growth surface of growth layer 2 is not flattened. It can be thus estimated that the growth mode of step-flow growth is not established due to setting the off-angle to be so small, 0.11 degrees.

Second Embodiment

Figure 4:
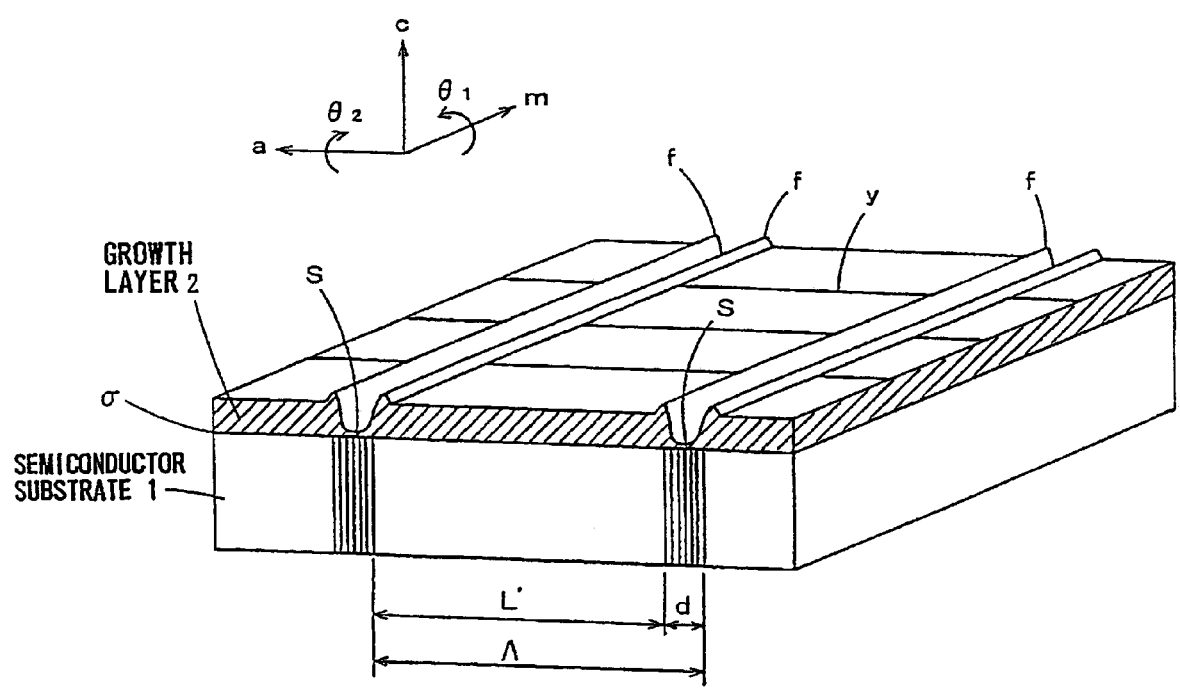
FIG. 4 is a schematic perspective view showing a growth layer 2 grown in the case that the polished surface $\sigma$ of semiconductor substrate 1 has a stripe-shaped specific region that is composed of a crystal defect-concentrated region.

FIG. 4 is a schematic perspective view showing a growth layer 2 grown in the case that the polished surface σ of semiconductor substrate 1 has a stripe-shaped specific region that is composed of a crystal defect-concentrated region. On the polished surface σ, there are provided a flat region with reduced crystal defect and with high crystal quality, and the crystal defect-concentrated region that are repeated with a certain period Λ (=400 μm) in the a-axis direction. The stripe-shaped specific region S is composed of the crystal defect-concentrated region, and has a stripe width d of about 50 μm. Thus, an interval L between neighboring stripes is about 350 μm.

The semiconductor substrate 1 used in the second preferred embodiment is a GaN substrate produced by Sumitomo Electric Industries, Ltd.

The crystal defect-concentrated region is described in prior art 10. A substrate with a stripe-shaped region called "core regions" is known and is in common use. The crystal defect-concentrated region may be formed by properly combining crystal growth methods as described in prior arts 7, 11 and 12.

The targeted growth layer 2 of gallium nitride (GaN) is not likely to grow on the stripe-shaped specific region S. Therefore, the source gases remaining without being used for the crystal growth over the specific region S are additionally supplied to the both edges of stripe-shaped specific region S. Thereby, at the edge portion, the upward growth speed is locally increased and, as a result, a pulse portion f is formed along the edge of growth layer 2.

In FIG. 4, y' indicates a step portion generated on the crystal growth surface of growth layer 2.

Figure 5A:
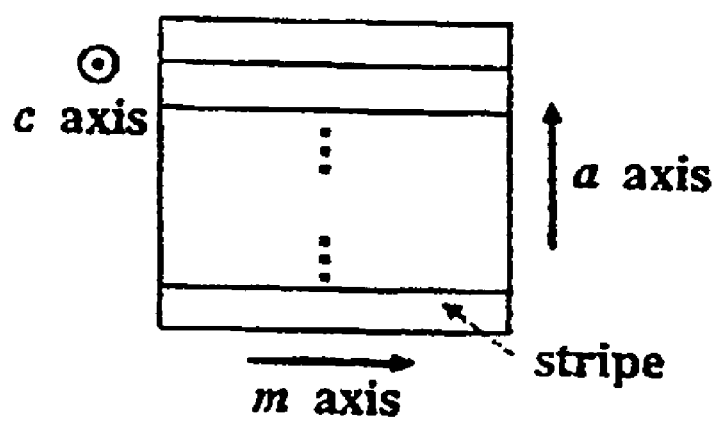
FIGS. 5A to 5C are photomicrographs showing a c-face of growth layer 2 in the case of forming a stripe-shaped specific region S.
Figure 5A:
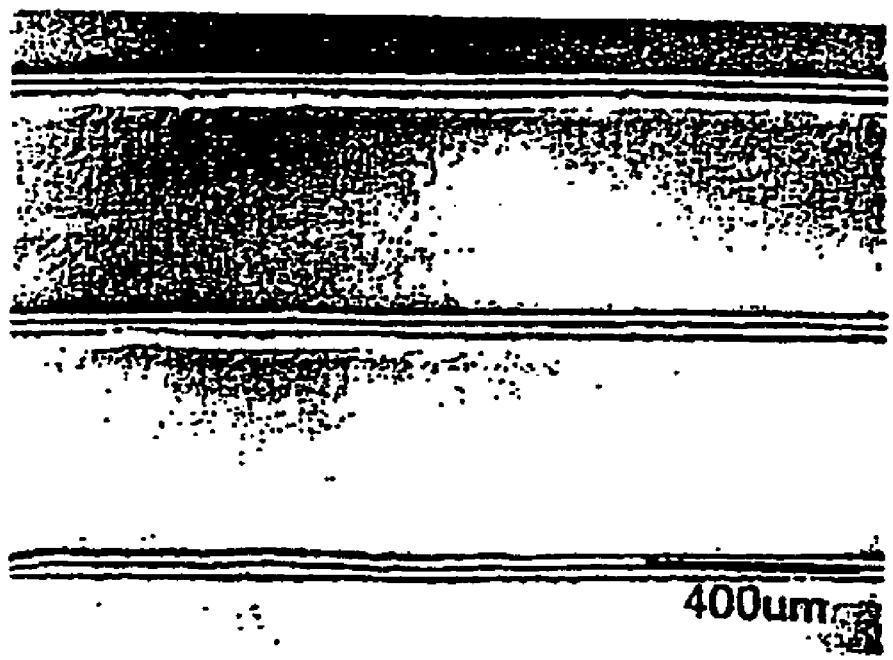
Figure 5B:
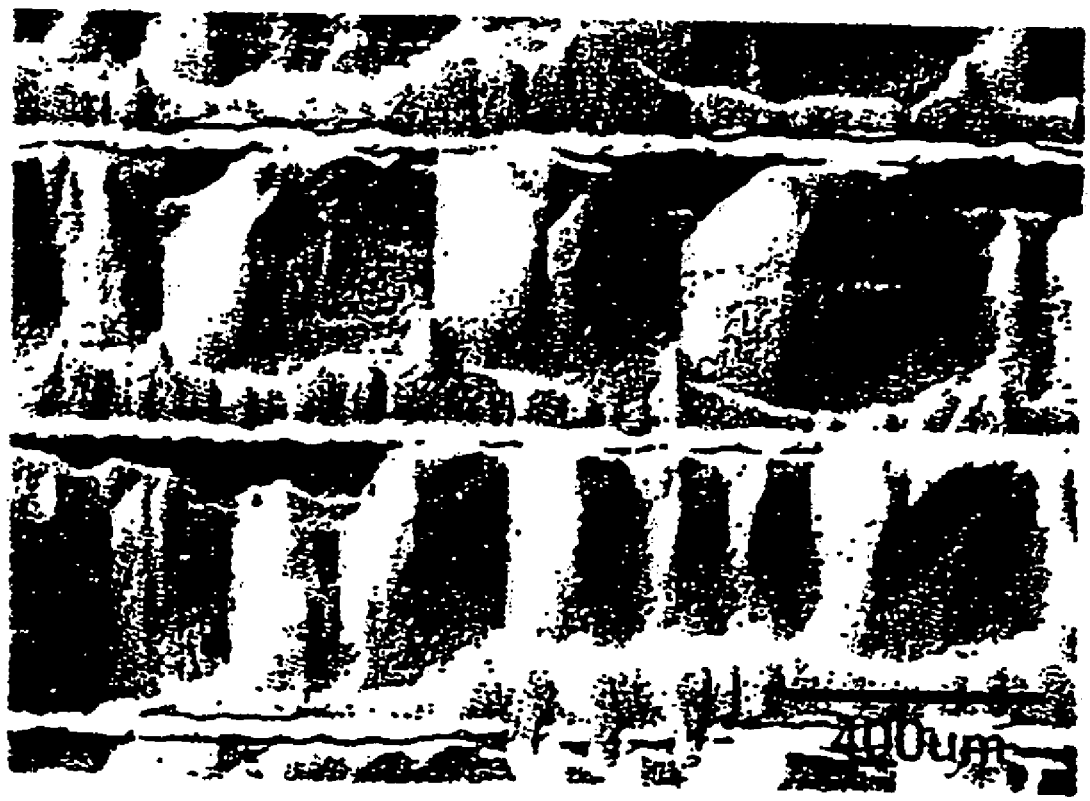
Figure 5C:

FIGS. 5A to 5C are photomicrographs showing a c-face of growth layer 2 in the case of forming a stripe-shaped specific region S. These samples are grown using the structure as shown in FIG. 4 and the same crystal growth process (MOVPE) as in the first embodiment described earlier. The off-angle is differentiated among the samples as shown in FIGS. 5A to 5C.

The setting of off-angle, as defined in FIG. 2A, for the samples in FIGS. 5A to 5C is as follows:

Example of this Embodiment

FIG. 5A $$\theta1=0.01 \text{ degrees}, \theta2=0.024 \text{ degrees} \tag{B}$$

Comparative Example

FIG. 5B $$\theta1=0.23 \text{ degrees}, \theta2=0.01 \text{ degrees} \tag{C}$$

Comparative Example

FIG. 5C $$\theta1=0.04 \text{ degrees}, \theta2=0.03 \text{ degrees} \tag{D}$$

With regard to the off-angle, only the example of this embodiment in FIG. 5A satisfies the next formula (E):
<Desired Setting of Off-Angle>

$$\theta^2 \approx \theta_2^2 (\theta_1 << \theta_2 < 1 \text{ deg}), 0.2 \text{ deg} \leq \theta \leq 0.035 \tag{E}$$

The conditions of crystal growth shown in the example of embodiment 2 (FIG. 5A) may be included in an exemplary aspect of the claimed invention herein. As a result, the growth layer 2 can be obtained that has a good flatness and a crystalline quality. Because of this, it is estimated that the functions and effects of the claimed invention may be embodied in the example of embodiment 2 (FIG. 5A).

ADVANTAGES OF THE INVENTION

The growth layer (group III nitride-based compound semiconductor) obtained according to the invention can offer an excellent semiconductor crystal material. Hence, the growth layer of the invention is very useful for various semiconductor devices, such as a semiconductor light emitting element such as a light emitting diode and a semiconductor laser, a semiconductor light receiving element, and semiconductor pressure sensor. Especially, it can widely serve as a crystal growing substrate of an electric device.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a group III nitride-based compound semiconductor, comprising:
   providing a semiconductor substrate comprising group III nitride-based compound semiconductor;
   polishing a surface of said semiconductor substrate such that said polished surface includes an inclined surface that has an off-angle θ of 0.15 degrees or more and 0.6 degrees or less to one of an a-face, a c-face and an m-face of the semiconductor substrate;
   providing a stripe-shaped specific region on the polished surface, the specific region comprising a material that prevents the growth of the group III nitride-based compound semiconductor on a surface of the material; and growing a semiconductor epitaxial growth layer of group III nitride-based compound semiconductor on the polished surface of the semiconductor substrate, wherein the specific region is provided on the polished surface such that the longitudinal direction of the specific region intersects with the longitudinal direction of a step portion that is formed with an atom-layer height on the polished surface by introducing the off-angle θ, wherein the longitudinal direction of the stripe-shaped specific region is substantially orthogonal to the longitudinal direction of the step portion that is formed with an atom-layer height on the polished surface by introducing the off-angle θ, wherein the material of the stripe-shaped specific region comprises an amorphous mask material, and wherein the stripe-shaped specific region comprises a plurality of stripe-shaped specific regions, and a width of the plurality of stripe-shaped specific regions is less than a distance between the plurality of stripe-shaped specific regions.

2. The method according to claim 1, wherein the plurality of stripe-shaped specific regions are formed substantially in parallel with each other on the polished surface.

3. The method according to claim 1, wherein said growing said semiconductor epitaxial growth layer comprises inducing step-flow growth by said off-angle θ.

4. The method according to claim 1, wherein said polished surface comprises said a-face and growing said semiconductor epitaxial growth layer comprises growing a layer of group III nitride-based compound semiconductor on said a-face, and said off-angle θ is given by $\theta=\sqrt{(\theta_1^2+\theta_2^2)}$, where $\theta_1$ is an off-angle to an c-axis direction, and $\theta_2$ is an off-angle to an m-axis direction.

5. The method according to claim 1, wherein the off-angle θ is in a range from 0.2 degrees to 0.24 degrees.

6. The method according to claim 1, wherein the polished surface comprises said c-face and growing said semiconductor epitaxial growth layer comprises growing a layer of group III nitride-based compound semiconductor on said c-face, and said off-angle θ is given by $\theta=\sqrt{(\theta_1^2+\theta_2^2)}$, where $\theta_1$ is an off-angle to an a-axis direction, and $\theta_2$ is an off-angle to an m-axis direction.

7. The method according to claim 1, wherein the polished surface comprises said m-face and growing said semiconductor epitaxial growth layer comprises growing a layer of group III nitride-based compound semiconductor on said m-face, and said off-angle θ is given by $\theta=\sqrt{(\theta_1^2+\theta_2^2)}$, where $\theta_1$ is an off-angle to an a-axis direction, and $\theta_2$ is an off-angle to an c-axis direction.

8. The method according to claim 1, wherein said group III nitride-based compound semiconductor comprises $Al_{1-x-y}Ga_yIn_xN$ ($0 \leq x \leq 1$, $0 \leq y \leq 1$, $0 \leq 1-x-y \leq 1$).

9. The method according to claim 1, wherein said providing said semiconductor substrate comprises growing a high-quality semiconductor crystal of GaN by hydride vapor phase epitaxy (HVPE).

10. The method according to claim 1, wherein said growing said semiconductor epitaxial growth layer comprises growing said semiconductor epitaxial growth layer directly on said polished surface.

11. The method according to claim 1, further comprising: after said polishing said surface, washing said substrate; and
heating said washed substrate to a predetermined temperature.

12. The method according to claim 11, wherein said growing said semiconductor epitaxial growth layer comprises growing said semiconductor epitaxial growth layer while maintaining said washed substrate at said predetermined temperature.

13. The method according to claim 1, wherein the growing of the semiconductor epitaxial growth layer comprises inducing step-flow growth by the off-angle θ, and wherein the longitudinal direction of the specific region intersects with the longitudinal direction of the step portion such that the specific region does not interfere with the step-flow growth.

14. The method according to claim 1, wherein a growth rate of the semiconductor epitaxial growth layer formed at edges of the plurality of stripe-shaped specific regions is greater than a growth rate of the semiconductor epitaxial growth layer formed between the edges of the plurality of stripe-shaped specific regions such that pulse portions are formed along the edges of the plurality of stripe-shaped specific regions.

15. The method according to claim 1, wherein the plurality of stripe-shaped specific regions are locally disconnected in the longitudinal direction of the specific regions.

16. A method of making a group III nitride-based compound semiconductor, comprising:
providing a semiconductor substrate comprising group III nitride-based compound semiconductor;
polishing a surface of said semiconductor substrate such that said polished surface includes an inclined surface that has an off-angle θ of 0.15 degrees or more and 0.6 degrees or less to one of an a-face, a c-face and an m-face of the semiconductor substrate;
providing a stripe-shaped specific region on the polished surface, the specific region comprising a material that prevents the growth of the group III nitride-based compound semiconductor on a surface of the material; and
growing a semiconductor epitaxial growth layer of group III nitride-based compound semiconductor on the polished surface of the semiconductor substrate, wherein the specific region is provided on the polished surface such that the longitudinal direction of the specific region intersects with the longitudinal direction of a step portion that is formed with an atom-layer height on the polished surface by introducing the off-angle θ, wherein the longitudinal direction of the stripe-shaped specific region is set to be parallel to an m-axis direction of the semiconductor substrate, wherein the material of the stripe-shaped specific region comprises an amorphous mask material, and wherein the stripe-shaped specific region comprises a plurality of stripe-shaped specific regions, and a width of the plurality of stripe-shaped specific regions is less than a distance between the plurality of stripe-shaped specific regions.

17. A method of making a group III nitride-based compound semiconductor, comprising:
providing a semiconductor substrate comprising group III nitride-based compound semiconductor;
polishing a surface of said semiconductor substrate such that said polished surface includes an inclined surface that has an off-angle θ of 0.15 degrees or more and 0.6 degrees or less to one of an a-face, a c-face and an m-face of the semiconductor substrate;
providing a stripe-shaped specific region on the polished surface, the specific region comprising a structure that has a relatively low growth speed in growing the group III nitride-based compound semiconductor on a surface of the structure, and growing a semiconductor epitaxial growth layer of group III nitride-based compound semiconductor on the polished surface of the semiconductor substrate, wherein the specific region is provided on the polished surface such that a longitudinal direction of the specific region intersects with the longitudinal direction of a step portion that is formed with an atom-layer height on the polished surface by introducing the off-angle θ, wherein the structure of the stripe-shaped specific region comprises an amorphous mask material, and wherein the stripe-shaped specific region comprises a plurality of stripe-shaped specific regions, and a width of the plurality of stripe-shaped specific regions is less than a distance between the plurality of stripe-shaped specific regions.

18. The method according to claim 17, wherein the polished surface comprises a flat region between the plurality of strip-shaped specific regions.

19. The method according to claim 18, wherein the growing of the semiconductor epitaxial growth layer comprises growing a first portion of the semiconductor epitaxial growth layer at the flat region of the polished surface, and growing a second portion of the semiconductor epitaxial growth layer at an edge of the stripe-shaped specific region, the second portion having a height which is greater than a height of the first portion.

* * * * *